United States Patent [19]

Ochi

[11] 4,441,123

[45] Apr. 3, 1984

[54] PHOTOSENSOR PATTERN OF SOLID-STATE IMAGING SENSORS

[75] Inventor: Shigeharu Ochi, San Jose, Calif.

[73] Assignee: Fuji Photo Film Co., Ltd., Kanagawa, Japan

[21] Appl. No.: 307,146

[22] Filed: Sep. 30, 1981

[51] Int. Cl.³ ............................................. H04N 9/07
[52] U.S. Cl. .................................................... 358/44
[58] Field of Search .................................... 358/43, 44

[56] References Cited

U.S. PATENT DOCUMENTS 4,242,700  12/1980  Weimer ................................ 358/44

*Primary Examiner*—Richard Murray
*Attorney, Agent, or Firm*—Sughrue, Mion, Zinn, Macpeak and Seas

[57] ABSTRACT

A solid-state color imager which eliminates moire fringes is disclosed. The imager includes, a base comprised of an array of solid-state switching elements, and a photosensitive layer, separate from and superimposed over the base, comprised of a top transparent electrode, an array of back mosaic electrodes and a light-sensitive material layer positioned therebetween. An array of multi-color filters are superimposed over the photosensitive layer. The filters, photosensitive layer and solid-state elements make up an array of pixels which are arranged in columns and rows to form the imager. The back electrodes have the same size, hexagonal shape and positioning as the filters. By arranging the pixels in overlapping columns and rows moire fringes can be eliminated.

8 Claims, 5 Drawing Figures

PHOTOSENSOR PATTERN OF SOLID-STATE IMAGING SENSORS

FIELD OF THE INVENTION

This invention relates to the field of solid-state color imagers, and more particularly to imagers having an array of solid-state pixel elements uniquely shaped and arranged in columns and rows in a manner so as to eliminate moire fringes.

BACKGROUND OF THE INVENTION

Within the field of solid-state color imagers, the production of a highly sensitive, high resolution, inexpensive imager is a well-recognized goal. In pursuit of this goal, a number of types of solid-state color imagers have been produced.

In one such imager, panchromatic image sensing elements in an array are selectively sensitized to color by means of an integral array of color filters disposed over the array of image sensing elements. Highly efficient configurations for such filter arrays that maximize the amount of usable image information, based on human visual acuity for color detail, have been described for example in U.S. Pat. No. 3,971,065 issued July 20, 1976 to Bayer, and U.S. Pat. No. 4,047,203 issued Sept. 6, 1977 to Dillon. However, the resolution capability inherent within such arrays is limited by the number of image sensing elements that can be placed on the array and are further limited in that only a portion of the elements in the array contribute to the resolution of fine detail. In addition, photosensitivity is limited in that only a portion of the array itself can be used as a photosensing area because the elements for each color are located at the same level as the other function of the device. Consequently, the special resolution of such integral filter color image sensing arrays, while optimized for the particular design, will not be as high as a monochrome image sensing array of the same number of elements. Furthermore, due to the shapes and patterns of filters utilized, and undesirable interference pattern referred to as moire occurs.

Moire is the spurious pattern which occurs in the reproduced picture resulting from interference beats between two sets of periodic structures in the image. Moires are produced, for example, by interference between the regular patterns in the original subject and the target grid in an image orthicon, between patterns in the subject and the line pattern and the pattern of phosphor dots of a three-color kinescope, and between any of the patterns and the pattern produced by the carrier color signal.

In order to increase sensitivity of the device, another structure has been proposed within U.K. Pat. No. 2,029,842 and Japanese Patent Application Laid Open (OPI) Nos. 55-39404; 55-27772; 55-2773; and 51-95720. The construction disclosed within these publications utilizes a photosensor superimposed on top of the information transfer device or MOS switching device. Due to the larger sensing area than is present with conventional imaging devices, where the photosensor is located on the same level as the information transfer device, the structure has significantly higher sensitivity. Due to the increased sensitivity obtained by utilizing a separate photosensor layer, this concept is utilized within the imager of the present invention. However, such structures utilize conventional filter shapes and patterns which result in moire interference as described above.

In an attempt to eliminate the moire interference problem as described above, a construction utilizing an offset arrangement of photosensing cells has been disclosed within Japanese Patent Application No. 50-128919. Another attempt to eliminate the moire pattern involves the production of an imager utilizing a one-dimensional offset pattern of the color filter array as disclosed within Japanese Patent Application No. 53-75728. Although the use of these offset patterns has some effect with respect to eliminating the moire interference, the interference is eliminated in only one dimension, i.e. in the vertical or horizontal dimension depending upon the manner in which the pattern is offset. Neither of the patterns is capable of eliminating the moire interference in both the vertical and horizontal dimensions.

SUMMARY OF THE INVENTION

The present invention provides a solid-state color imager which can eliminate moire interference in both the vertical and horizontal dimensions. By utilizing an imager construction having a photosensitive layer superimposed on the semiconductor image transfer array base, increased sensitivity is obtained. Furthermore, due to the use of hexagonal shaped multi-color filters positioned over the photosensor layer in combination with hexagonal shaped electrodes within the photosensitive layer, overlapping rows and columns of pixels are obtained, moire interference is eliminated and the resolution capability of the imager is increased.

The invention is comprised of an array of filters and photosensitive elements formed above a semiconductor substrate. The substrate includes a scanning means for scanning the photosensitive elements of the photosensitive layer is succession. The photosensitive layer and the photosensitive elements of the layer are comprised of three sublayers including a front transparent electrode and a back mosaic electrode having the photosensitive material sublayer positioned therebetween. Hexagonal shaped multi-color filters are positioned on the front transparent electrode sublayer. The back mosaic electrodes are positioned directly beneath the hexagonal filters and have the same size, shape and positioning as the filters. By utilizing the hexagonal shapes and positioning the filters and electrodes in this manner, the unwanted moire interference pattern is eliminated in both the vertical and horizontal planes.

It is a primary object of this invention to present a solid-state color imager comprised of a base which is a semiconductor array of elements; the base having a photosensitive layer superimposed thereon and a plurality of hexagonal shaped multi-color filters imposed thereon in such a manner so as to eliminate moire interference patterns.

Another object of this invention is to present a solid-state color imager which is highly sensitive to light.

Still another object of this invention is to present a solid-state color imager which can produce an image with high resolution.

Yet another object of this invention is to present a solid-state color imager which combines hexagonal shaped multi-color filters with hexagonal shaped electrodes within the photosensitive layer of the imager in such a manner so as to eliminate moire interference patterns within the vertical and horizontal planes.

These and other objects and advantages of the present invention will become apparent to those skilled in the art upon reading the details of construction and usage as more fully set forth below, reference being made to the accompanying drawings forming a part hereof wherein like numerals refer to like parts throughout.

DESCRIPTION OF THE PREFERRED EMBODIMENTS

Before the present solid-state color imager is described, it is to be understood that the invention is not limited to the particular arrangement of components shown, as such devices may vary. It is also to be understood that the terminology used herein is for purposes of describing particular elements, and is not intended to be limiting since the scope of the present invention will be limited by the appended claims.

Figure 1:
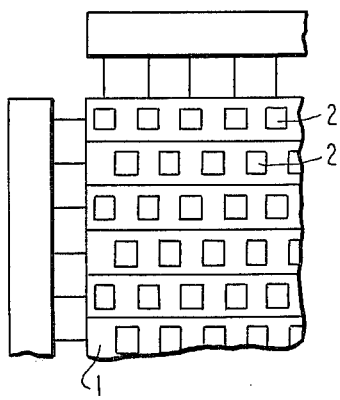
FIG. 1 is a top plan view showing an offset arrangement of photosensing elements.
Figure 2:
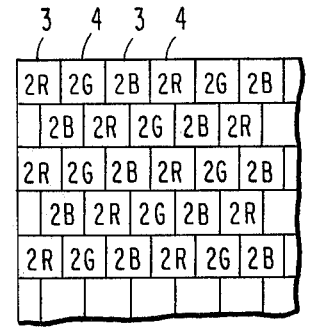
FIG. 2 is a top plan view showing an offset arrangement of multi-color filters.

A prior attempt to reduce moire fringes is illustrated in FIGS. 1 and 2 which show the light-sensitive active elements 2 and the superimposed multi-color filters 3 and 4, respectively. Offsetting the elements and filters in a single direction aids in reducing moire fringes. However, it only reduces moire fringes in one dimension. Furthermore, since the photosensitive portion of each pixel is less than the entire pixel area, the photosensitive area cannot be overlapped sufficiently, or at all, in order to sufficiently reduce the moire fringes.

Recent pixels for solid-state imagers separate the photosensitive function from the storage and transfer functions, the former being carried out by a photoconductor overlying the semiconductor element, e.g., MOS, which carries out the latter function. An example of such a pixel is shown in U.K. Pat. No. 2,029,842, and is shown herein as FIG. 3. The disclosure of U.K. Pat. No. 2,029,842 is incorporated herein by reference.

Figure 3:
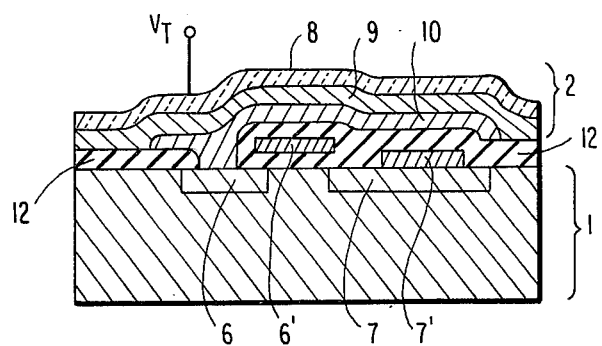
FIG. 3 is a cross-sectional plan view of a solid-state color imager.

The imager as disclosed herein, and as described in part within the United Kingdom Patent referred to above, is comprised of thousands of pixels of the type shown within FIG. 3. The pixels are arranged in a plurality of rows and columns, with each pixel element forming a tiny portion of the image formed by the imager as a whole.

The present invention utilizes pixel elements of the general type shown within FIG. 3, but varies the geometrical shape of the color filters and the mosaic back electrodes attached to the photosensitive layer. The shape of the filters and electrodes within the imager of the present invention are designed in order to obtain overlap of adjacent rows and columns of the pixel elements. Accordingly, the pixels overlap in both the horizontal and vertical directions, e.g., by shaping the pixels in a hexagonal shape and positioning them in adjacent rows and columns. By achieving the overlap in both the horizontal and vertical directions, it is possible to reduce the moire fringes.

Figure 5:
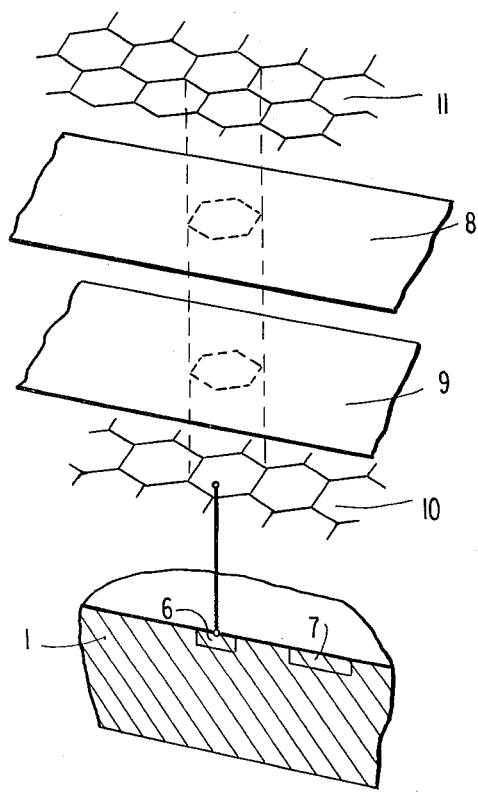
FIG. 5 is an expanded perspective view of the solid-state color imager of the present invention.

The pixel of FIG. 3 is composed of an MOS storage transistor comprising a substrate 1, source region 6, drain region 7, and source, drain and gate terminals 10, 7', and 6', respectively. Superimposed on the MOS device is a photosensitive layer 2 comprising a photoconductor layer 9, an upper transparent electrode 8 and a bottom electrode 10, which also connects to or serve as the source terminal. Insulator layers 12 are also provided as shown. In FIG. 5 to be discussed more fully hereafter the bottom electrode 10 is shown schematically connected to the drain of an MOS. However, actual connection is more like that shown in FIG. 3. Thus, although one may refer to the bottom electrode as being connected to the drain (or source) terminal such a description is intended to include the arrangement whereby an electrode, e.g. 10, serves as the bottom electrode and the drain (or source) terminal.

As is apparent and as described in the above mentioned British patent, the light sensing pattern of the pixel is the photosensing layer, and the MOS performs charge transfer. Thus, the light sensing portion can be made as large in area as the entire pixel. In an overall array the photoconductor layer 9 and the top electrode 8 may be continuous, but the back electrode 10 is a mosaic, i.e. a separate back electrode must be provided for each pixel. Instead of an MOS device, CCD's or other charge storage and transfer devices could be used.

No filter layers are shown within FIG. 3. However, on an actual imager, in accordance with the present invention, an array of thousands of filters are superimposed over the front transparent electrode sublayer 8. It is also possible to include a broad band continuous filter positioned over the multi-color filters. Such a broad band type of filter can be designed so as to filter out all light not visible to the human eye e.g., infrared and ultra-violet light filters.

Figure 4:
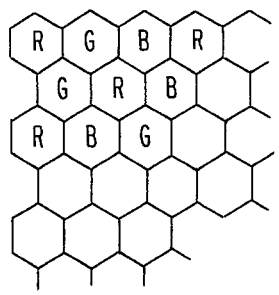
FIG. 4 is a top plan view of the hexagonal shape and pattern of the multi-color filters of the present invention.

In accordance with the present invention, the filters are arranged such that the adjacent rows and columns both overlap each other. In order to obtain the overlap of both the adjacent rows and adjacent columns, it has been found that a preferable shape, for both the filters and the underlying mosaic back electrodes is a hexagonal shape. Accordingly, the hexagonal shaped pixel elements are shaped and arranged in a manner as shown within FIG. 4 in accordance with the preferred embodiment of the present invention.

Referring now to FIG. 5, an exploded perspective view of a portion of the solid-state color imager of the present invention is shown. Hexagonal filters 11 comprise the top or front layer of the imager when no broad band filter such as an infrared or ultraviolet filter is utilized. The filters 11 are multi-color filters and the color pattern is arranged in a manner such as shown within FIG. 4. Alternative arrangements of the color pattern may be used depending upon the particular result desired. The filters are positioned on the transparent electrode sublayer 8. The sublayer 8 is superimposed on photosensitive sublayer 9. The photosensitive material of the sublayer 9 is positioned between the electrode layer 8 and the array of hexagonal shaped back electrodes 10. The sublayer 10 is the back mosaic electrode layer. The electrodes 10 are comprised of aluminum or an aluminum alloy and each electrode 10 is electrically connected to a respective underlying switching element in the semiconductor base, such as shown in more detail in FIG. 3. The electrodes 10, of necessity, are set in electrical contact with another, and the switching elements are also electrically isolated from one another by conventional means.

By arranging both the filters 11 and the electrodes 10 in a hexagonal shape directly over each other, the rows and columns of pixel elements overlap in both the vertical and horizontal planes. Accordingly, it is possible to eliminate moire interference patterns in both the vertical and horizontal planes.

Various arrangements and numbers of different color filters can be provided depending upon the particular results desired. However, the shape of the filters and back electrodes must be maintained in overlapping rows and columns, preferably in hexagonal shapes, in order to reduce the moire fringes in both the vertical and horizontal planes. Highly efficient configuration of the placement for such filter in arrays that maximize the amount of usable image information, based on human visual acuity for color detail, have been described in U.S. Pat. No. 3,971,065, issued July 20, 1976 to Bayer and U.S. Pat. No. 4,047,203, issued Sept. 6, 1977 to Dillon, both of which are incorporated herein by reference. Modifications of these arrangements may be needed due to the use of the overlapping rows and columns of the present invention.

Depending upon the particular type of photosensitive layer which is utilized, and the use to which the device is put, different amounts of voltage can be used in the operation of the device. Furthermore, different voltages can be utilized in connection with different terminals positioned between different color filters depending upon particular results desired. The intensity of any particular color of light can be determined by the degree of change of resistance of the photosensitive material sublayer, with greater changes in resistance indicating greater intensity of light.

The present solid-state color imager has been disclosed and described herein in what is considered to be the most practical, and preferred embodiments. The reference to particular materials, terminologies and color filters is done merely to disclose preferred embodiments. It is recognized, however, that departures may be made therefrom which are within the scope of the invention and that modifications will occur to one skilled in the art upon reading this description.

What is claimed is:

1. A solid-state color imager of the type having an array of solid-state pixels arranged in columns and rows and each adapted to produce an electrical signal representing light intensity, said pixels being of the type having the light sensitive part separate from and electrically connected to the signal switching part, each said pixel light sensitive area being defined by the pattern of the bottom electrode on said light-sensitive part which connects to said signal switching part, the improvement comprising, said bottom electrodes forming a pattern whereby adjacent pixels overlap in both the column and row direction, and a multicolor filter overlaying said pixels and being patterned corresponding to said bottom electrode pattern.

2. A solid-state color imager, comprising:
   (a) a base comprised of an array of solid-state elements arranged in a plurality of rows and columns on said base, said elements being capable of storing and switching electrical signals;
   (b) a photosensor layer superimposed over said base, said photosensitive layer being comprised of:
      (i) a front transparent electrode sublayer;
      (ii) a mosaic array of a plurality of back electrodes each electrically connected to a respective one of said elements of said base;
      (iii) a photosensitive sublayer positioned between said front and back electrodes;
   (c) an electrical insulation layer positioned between said base and said back electrodes; and
   (d) an array of a plurality of multi-color filters superimposed on said front electrode sublayer of said photosensor layer, said solid-state elements, photosensor layer and filters forming a plurality of pixels arranged in a plurality of rows and columns such that adjacent rows and columns of pixels overlap.

3. A solid-state color imager, as claimed in claim 2, wherein said back electrodes and said filters each have a hexagonal shape.

4. A solid-state color imager, as claimed in any of claims 2 or 3, wherein said filters are multi-color filters of three types wherein a first type filters out red light, a second type filters out green light and a third type filters out blue light.

5. A solid-state color imager, as claimed in any of claims 2 or 3, wherein said solid-state elements are of the MOS type.

6. A solid-state color imager as claimed in any of claims 2 or 3, wherein said solid-state elements are of the CCD type.

7. As solid state color imager as claimed in claim 3 wherein all said filters and back electrodes are regular hexagons of equal size.

8. A solid-state color imager, as claimed in any of claims 2 or 3, wherein said filters are multi-color filters including complementary colors.

* * * * *